United States Patent [19]
Seo et al.

[11] Patent Number: 5,537,346
[45] Date of Patent: Jul. 16, 1996

[54] SEMICONDUCTOR MEMORY DEVICE OBTAINING HIGH BANDWIDTH AND SIGNAL LINE LAYOUT METHOD THEREOF

[75] Inventors: Dong-Il Seo, Suwon; Se-Jin Jeong, Seoul, both of Rep. of Korea

[73] Assignee: Samsung Electronics Co., Ltd., Suwon, Rep. of Korea

[21] Appl. No.: 352,090

[22] Filed: Nov. 30, 1994

[30] Foreign Application Priority Data

May 20, 1994 [KR] Rep. of Korea .......................... 11050

[51] Int. Cl.[6] ..................................... G11C 5/02
[52] U.S. Cl. ................................. 365/51; 365/63
[58] Field of Search .......................... 365/51, 63, 210, 365/230.03

[56] References Cited

U.S. PATENT DOCUMENTS

| | | | |
|---|---|---|---|
| 5,021,998 | 6/1991 | Suzuki | 365/51 |
| 5,291,432 | 3/1994 | Furutani | 365/51 |
| 5,293,559 | 3/1994 | Kim | 365/63 |
| 5,321,646 | 6/1994 | Tomishima | 365/51 |
| 5,418,737 | 5/1995 | Tran | 365/63 |
| 5,426,615 | 6/1995 | Tomishima | 365/63 X |

*Primary Examiner*—David C. Nelms
*Assistant Examiner*—Son Mai
*Attorney, Agent, or Firm*—Cushman Darby & Cushman

[57] ABSTRACT

A semiconductor memory device architecture and method thereof obtains a high data bandwidth by forming multiple input/output lines. A unit array has a plurality of reference blocks formed in a length direction of the device, each reference block storing a plurality of memory cells. A sub array has a plurality of unit arrays formed in a longitudinal direction perpendicular to the length direction. A word line selects memory cells from within the reference blocks, the word line extending in the length direction. A pair of bit lines and a pair of data input/output lines extend in the longitudinal direction. The pair of data input/output lines are correspondingly connected to $2^n(n=1,2,\ldots)$ pairs of bit lines. A read select signal line selects a pair of bit lines from among $2^n$ pairs of bit lines connected to one pair of data input/output lines in response to an input of a column address during a read operation. A write select signal line selects a pair of bit lines from among $2^n$ pairs of bit lines connected to one pair of data input/output lines in response to an input of a column address during a write operation. A column gate connects the pair of bit lines to the pair of data input/output lines. A column select line extends in the longitudinal direction and controls the column gate, and a pair of main data input/output lines are connected correspondingly through a multiplexer to a plurality of data input/output lines.

38 Claims, 11 Drawing Sheets

SEMICONDUCTOR MEMORY DEVICE OBTAINING HIGH BANDWIDTH AND SIGNAL LINE LAYOUT METHOD THEREOF

BACKGROUND OF THE INVENTION

1. Field of the Invention

The present invention relates to a semiconductor memory, and more particularly, to a semiconductor memory device having a high bandwidth and a signal line layout method thereof by achieving a chip architecture formed with multiple input/output lines.

2. Description of Related Art

An important consideration in semiconductor memory design is to select an appropriate architecture. Parameters indicative of the performance of a semiconductor memory are, for example, power consumption, speed, size and the like are typically determined by the architecture. Therefore, the more flexible the chip architecture is, the more the parameters of the semiconductor memory are satisfied sufficiently. Flexibility of a semiconductor memory means that a basic frame can be maintained even though a peripheral circuit is altered or added and the degree of integration increases. Flexibility also means that these variations can occur easily.

Current trends in the industry are the pursuit of both high bandwidth as well as high integration. Furthermore, new memory devices having bandwidth capable of synchronizing with a high system speed instead of with only a simple highly integrated memory device are being developed. There is a need for memory devices in a class with an integrated degree of over 64 Megabit (64 Mb), in particular RAMBUS dynamic RAM or synchronous dynamic RAM having a mother version of 265 Mb dynamic RAM for example, to process 256 data bits in one operating cycle.

In order to satisfy the needs of the industry for memory devices to have a high bandwidth, the architecture of a memory device to be used as mother version of 256 Megabit class should have an internal bandwidth of about 256 bits (one cycle). Currently, the industry designs to satisfy this need are trending toward the development of an architecture which increases the internal bandwidth. Meanwhile, as the degree of integration is raised, the size of a memory chip becomes larger and the loading of each signal line increases. Hence, there are difficulties in reading and writing data.

FIG. 1 illustrates the architecture of 256 Mb memory published in various papers. The configuration of an internal column related circuit based on the architecture shown in FIG. 1 is disclosed in, for example, U.S. Pat. No. 5,247,482, entitled "Semiconductor Memory Device With High Speed Write Operation". When a typical folded bit line structure is adopted, 32K word lines and 16K bit lines are needed to achieve a 256 Mb dynamic RAM. Although not excluding a technique for connecting 512 cells to one bit line in the future, since 256 cells per bit line are generally connected, a 2M array is activated by one word line. Assuming that a refresh cycle is 16K, 2 word lines are enabled in the length direction of a chip by the activation of a row address strobe signal $\overline{RAS}$ and 8M array is activated in 256 Mb. If the activation is performed as shown in FIG. 1 and two pairs of input/output lines are positioned at a sense amplifier region, the number of data obtained in 2M array is 4 which corresponds to the number of input/output lines. Therefore, 16 data bits are obtained in a 256 Mb device. Since 16 data bits are far fewer than are necessary to achieve an internal bandwidth of 256 bits, it is difficult to obtain a high bandwidth with this architecture. Furthermore, since the line loading of an input/output line and junction loading of gate transistors connecting the input/output line to a bit line is large, a voltage of the input/output line during a read operation is not readily developed. During a write operation, the loading of the input/output line is similarly large and the write operation is performed through a gate transistor of an input/output line in the same way as with the read operation. However, because a data input/output line shown in FIG. 1 is directly connected to the bit line through the gate transistor, the input/output line deteriotates the junction loading and the bit line. Therefore, it has been appreciated by the present inventors that the architecture shown in FIG. 1 is not suitable for a highly integrated memory device having a high bandwidth.

FIG. 2 illustrates another example of the architecture of a semiconductor memory which has reduced line loading and higher data bandwidth as compared with that of FIG. 1. The architecture of FIG. 2 is described in 1991 SYMPOSIUM ON VLSI CIRCUITS, entitled "Circuit Techniques for a Wide Word I/O Path 64 Mega DRAM", pp. 133–134. In FIG. 2, the loading of an input/output line is reduced by the use of a sub input/output line and a local input/output line. Data is transmitted to the local input/output line through a differential amplifier stage by incorporating a predetermined number of sense amplifiers into the sub input/output line. During a write operation, with the architecture of FIG. 2, many NMOS transistors have data transmitted thereby.

FIG. 3 illustrates the path of data input/output in the architecture of FIG. 2. During a write operation, data on the local input/output line is transmitted to transistor 2 by an enable select signal SEC SELECT having column information of a selected block. When a write enable signal YWRITE, which determines the sub input/output line, is enabled, data is transmitted to the sub input/output line through transistor 4. When a bit line information signal S/A SELECT is enabled to select bit lines connected to one sub input/output line, data is transmitted to the corresponding bit line through transistor 10. Consequently, data from the input/output line to the bit line must be transmitted via as many as three NMOS transistors 2, 4, 10 during a write operation. Thus, the architecture of FIG. 2 of a highly integrated memory device with large line loading is disadvantageous.

SUMMARY OF THE INVENTION

It is an object of the present invention to provide an architecture of a semiconductor memory device and a method for signal line layout thereof which achieves a high bandwidth.

It is another object of the present invention to provide an architecture of a semiconductor memory device and a method for signal line layout thereof which achieves device performance having a high speed data access operation during read and write operations.

It is still another object of the present invention to provide an architecture of a semiconductor memory device and a method for signal line layout thereof which suppresses sufficiently the otherwise disadvantageous effects of line loading based on a bit line and an input/output line during data transmission.

It is a further object of the present invention to provide an architecture of a semiconductor memory device and a method for signal line layout thereof which achieves a high bandwidth and performs a high speed write operation without additional local input/output lines connecting a bit line to a main input/output line.

To achieve these and other objects, the present invention provides a semiconductor memory device with an architecture which obtains a desired high bandwidth.

A semiconductor memory according to the present invention has an architecture wherein a plurality number of memory cells and a bit line conveying cell data are independently connected to a corresponding input/output line in response to a selection of a word line, thus obtaining a high bandwidth.

A semiconductor memory device according to the present invention includes a row decoder arranged such that a word line is formed in the length direction of a chip and a column decoder is arranged such that a bit line and a column select line are formed at right angles with the length direction.

A semiconductor memory device according to the present invention has an architecture wherein a main input/output line is correspondingly connected to a plurality of data input/output lines one by one and is provided between a bit line and a data input/output line terminal of a chip.

In accordance with one aspect of the present invention, a semiconductor memory device includes a memory cell array having a plurality of reference blocks each storing a plurality of memory cells. A word line extends in the length direction of a chip, and a pair of bit lines have a bit line and a complementary bit line. The pair of bit lines extend in a longitudinal direction perpendicular to the length direction. A pair of data input/output lines have a data input/output line and a complementary data input/output line, the pair of data input/output lines extending in the longitudinal direction, are correspondingly connected to a plurality of bit lines, and are formed over the memory cell array. A column select line extends in the longitudinal direction, is adjacent to the pair of data input/output lines, and controls the connection between the pair of bit lines and the pair of data input/output lines.

In accordance with another aspect of the present invention, a signal line layout method of a semiconductor memory device includes the step of forming a memory cell array by arranging a plurality of reference blocks for respectively storing a plurality of memory cells in the form of matrix. A word line is formed for selecting a row of the memory cells to be extended in the length direction of a chip. A pair of bit lines are formed for selecting a column of the memory cells to be extended in a longitudinal direction perpendicular to the length direction. The pair of bit lines have a bit line and a complementary bit line and form a pair of data input/output lines over the memory cell array. The pair of data input/output lines are arranged to be extended in the longitudinal direction, and are correspondingly connected to a plurality of bit lines. The pair of data input/output lines have a data input/output line and a complementary data input/output line. A column select line is formed adjacent to the pair of data input/output lines in the longitudinal direction to control the connection between the pair of bit lines and the pair of data input/output lines.

A semiconductor memory device and signal line array method and architecture according to the present invention achieves a high bandwidth memory device. Moreover, layout according to the architecture of the present invention is facilitated in the column direction as well as in the row direction. Since only two data input/output lines for transmitting data are needed between a cell array and an input/output stage of a chip, the layout is improved and a high integration is easily obtained. Furthermore, line loading problems exhibited by conventional architectures are minimized. In particular, bandwidth is increased by adjusting connecting methods between the bit line and the data input/output line, and between the data input/output line and the main data input/output line.

BRIEF DESCRIPTION OF THE DRAWINGS

The advantages and features of the present invention will become more apparent from the detailed description herein, with reference to the attached drawings in which like reference characters generally refer to the same parts throughout the views, wherein.

DESCRIPTION OF PREFERRED EMBODIMENTS

In the following description, specific details such as a vertical structure of an input/output line, a bit line sensing circuit, a multiplexer, etc. are provided in order that the present invention may be thoroughly understood. It will be apparent, however, to one skilled in the art, that the present invention may be practiced without these specific details.

In the preferred embodiment of the present invention, a "unit array" or "unit memory cell array" represents a memory cell array which can be activated by one word line. A "sub array" means a cell array which can be selected by one row decoder group and one column decoder group and consists of a plurality of unit arrays sharing a data input/output line connected to one multiplexer group.

Figure 4A:
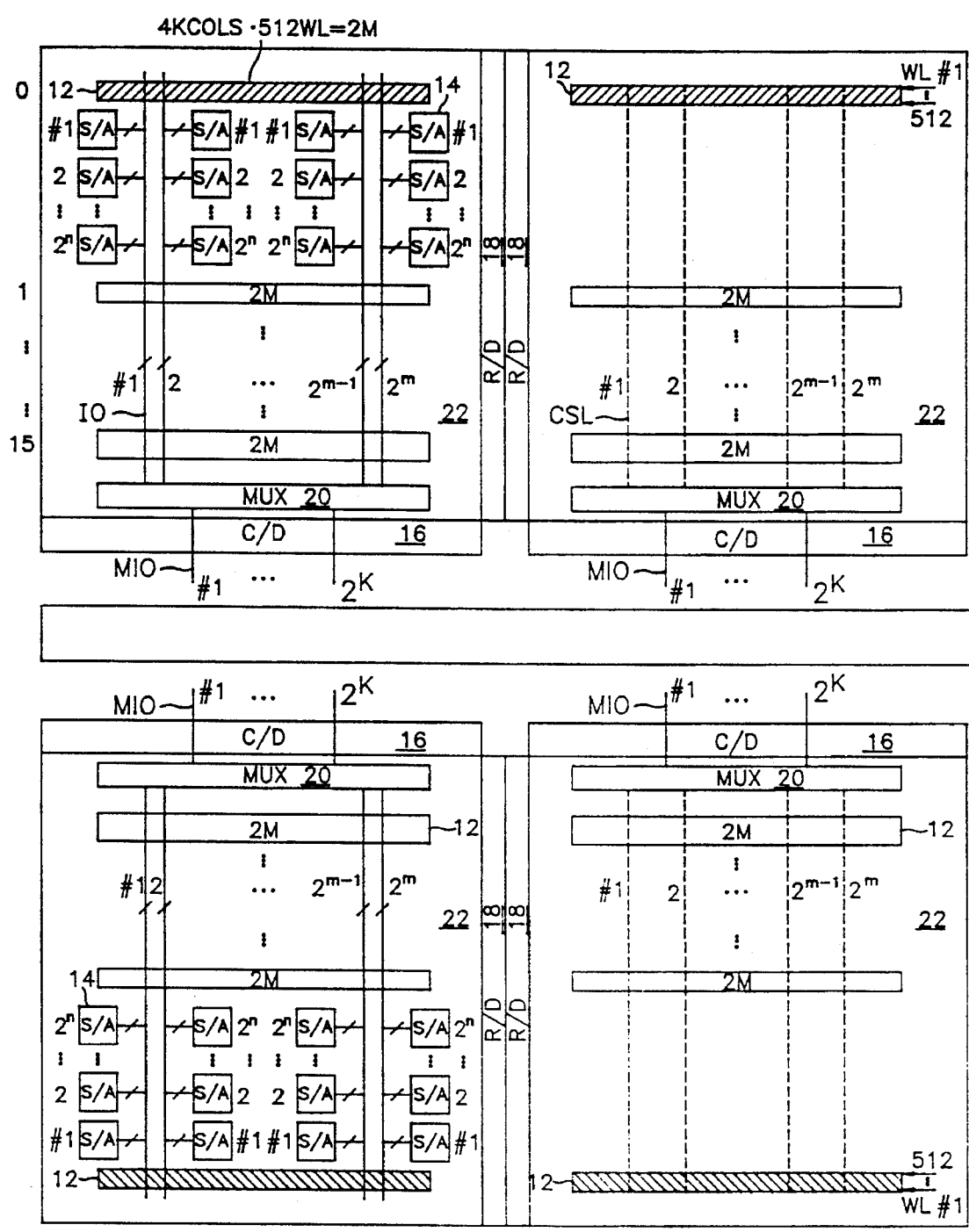
FIGS. 4A and 4B are diagrams showing a chip architecture with multiple input/output lines of a semiconductor memory according to the present invention.
Figure 4B:
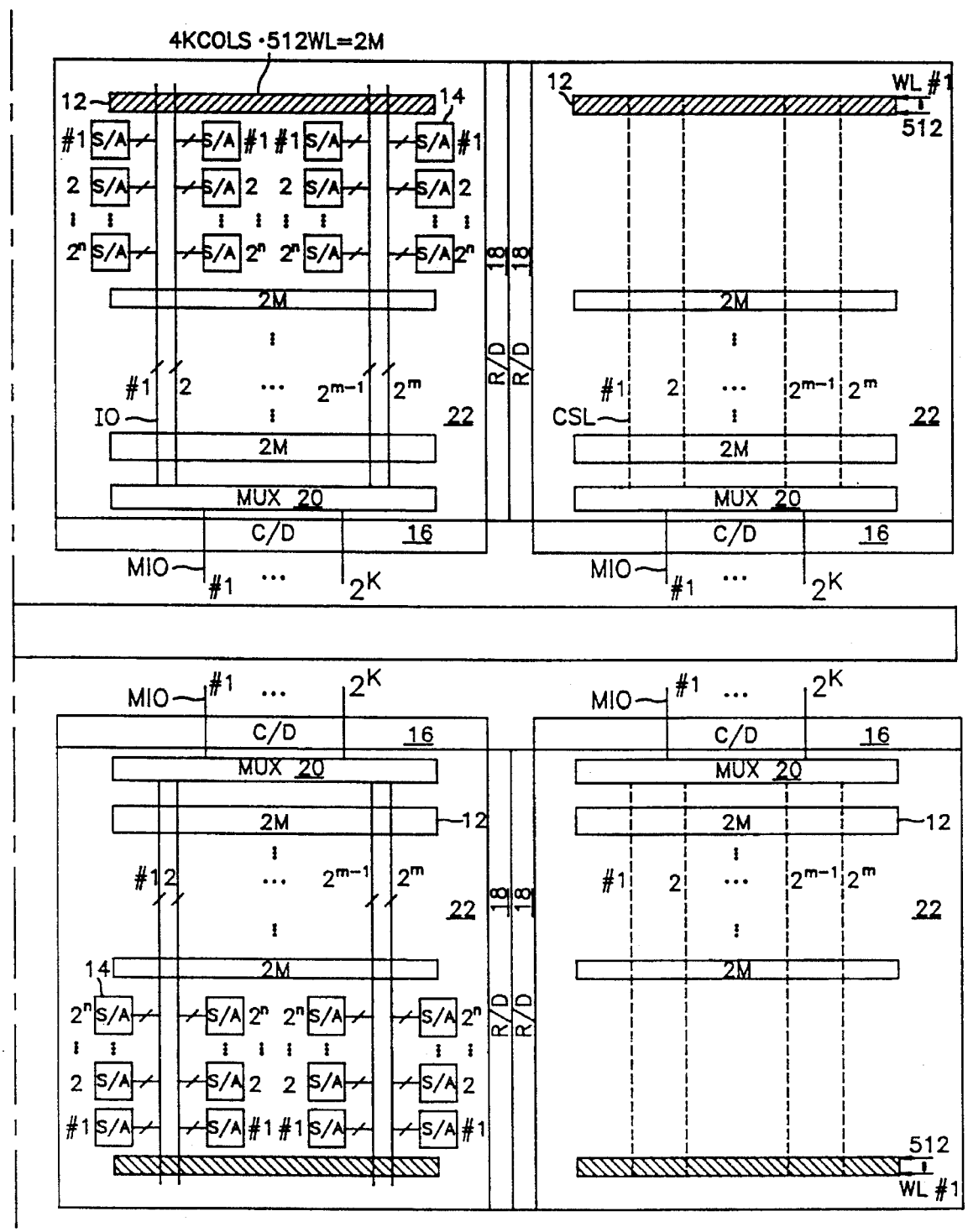

FIGS. 4A and 4B illustrate a chip architecture having multiple input/output lines of a semiconductor memory according to the present invention. FIGS. 4A and 4B are laterally constructed in parallel on the same chip. FIGS. 4A and 4B show the architecture of a memory device constructed in accordance with the present invention, for example, a 256 Mega DRAM.

Two banks of memory are shown at the upper and bottom portions of FIGS. 4A and 4B, respectively. Reference numerals 22, 12 designate a sub array and a unit array, respectively. Two sub arrays 22 exist in one bank and sixteen unit arrays 12 exist in one sub array 22. One unit memory cell array 12 consists of 2M (M=$2^{20}$) bits and one sub array 22 consists of 32M bits (=2M×16). Hence, one bank has 64M bits. A row decoder (R/D) 18(64M bits are partitioned into two groups of 32M bits each with the row decoder) extends in the length direction of a chip and a memory and is activated in the length direction of the chip, i.e. in the direction of a word line. Therefore, the activation is carried out in the length of the chip by the unit array which exists in the identical line.

A bit line, data input/output line and column select line are positioned at right angles with the direction of the word line. In two sub arrays 22 which are adjacent to each other within one bank of FIGS. 4A and 4B, one side of the sub array 22 illustrates a data input/output line IO and the other side thereof shows a column select line CSL in order to avoid the confusion of structures of the data input/output line IO and column select line CSL. Data input/output lines IO and column select lines CSL exist within one sub array 22 as many as the indicated number. To reduce signal interference, it is preferable to form the column select lines so as not to directly adjoin each other, and to form the data input/output lines IO and $\overline{IO}$0 so as not to directly adjoin each other. The architecture shown in FIGS. 4A and 4B is advantageous over the conventional architecture because there is no need to provide local data input/output lines as shown in the conventional architecture of FIG. 2 to extract data simultaneously. Thus, using the architecture of the present invention, a high speed write operation is possible.

The unit array 12 constitutes a basic block of the sub array 22 of 32 Mbits with a unit array 12 consisting of 16 reference blocks of 128 Kbits, each reference block consisting of 512 word lines and 512 bit lines (256 pairs of bit lines). Hence, 4096(256 columns×16) pairs of bit lines exist within one unit array 12. When performing a refresh in units of 16 Kbits, one word line and arrays of 2 Mbits are activated from one bank of 64M.

The number of data input/output lines within 2 Mbits is now described. If $2^n$ pairs of bit lines are connected to one data input/output line, there are 4096/$2^n$ (=$2^m$) pairs of input/output lines. When incorporating the data input/output lines into a multiplexer 20, $2^k$ main data input/output lines MIO (consisting of pairs) are obtained. That is, by the activation of a row address strobe signal $\overline{RAS}$, 4096/$2^n$ (=$2^m$) data input/output lines and $2^k$ main data input/output lines are obtained within 2M, and $2^k$×4 data bits are obtainable within 256M.

For example, if 8 pairs of bit lines are connected to one data input/output line, there are 512 pairs of data input/output lines. If 8 pairs of data input/output lines are grouped into one main data input/output line MIO, 64 pairs of main input/output lines MIO are obtained. Therefore, if there are 64 pairs of main input/output lines with respect to one sub array 22, 256 data bits are obtained in a 256 Mbit device. Thus, if it is necessary to increase the number of bits, the architecture according to the present invention has flexibility which allows adjustment of the number of bit line pairs connected to the data input/output line and the number of data input/output line pairs connected to the main data input/output line.

Figure 5:
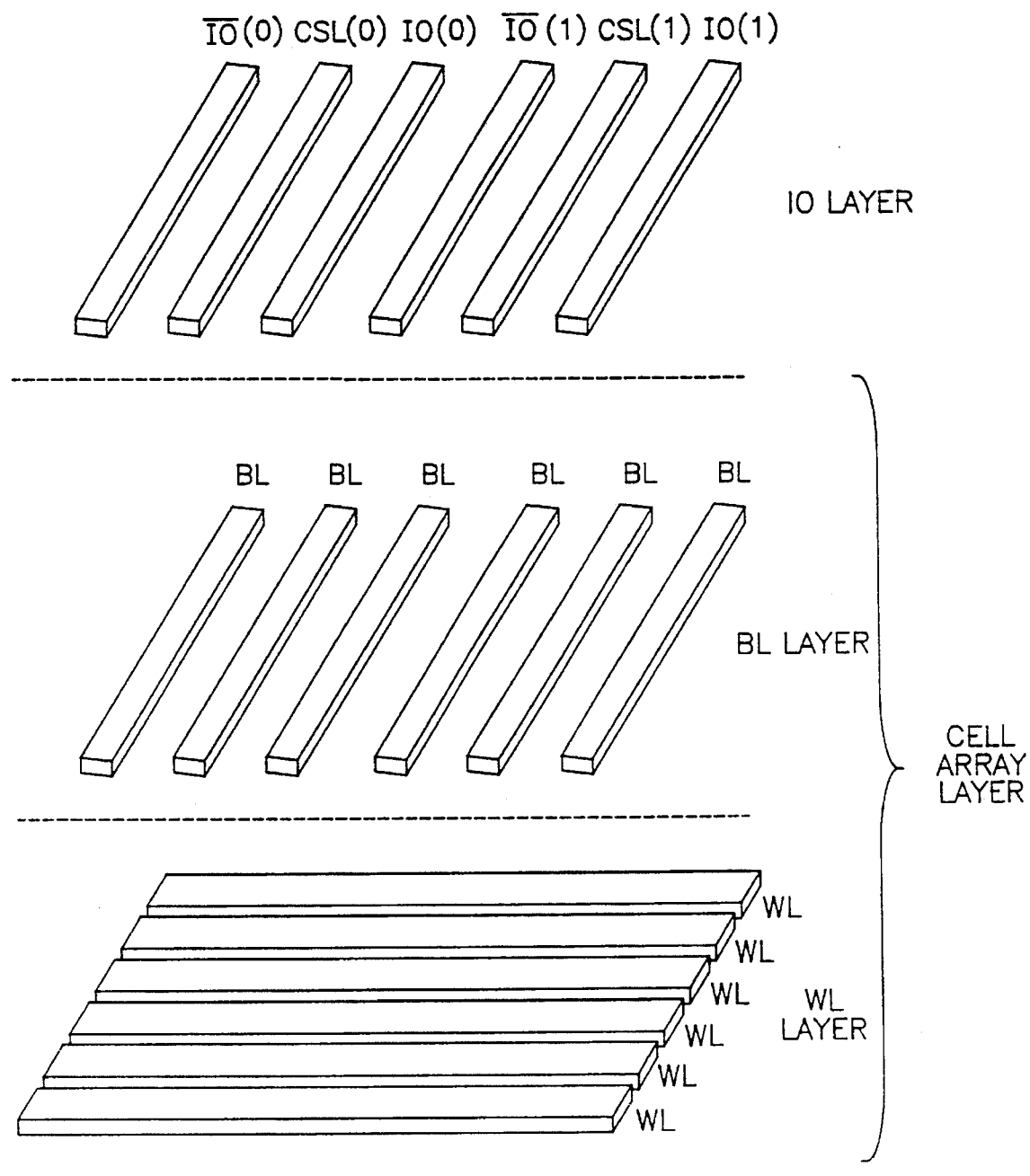
FIG. 5 is a diagram showing an example of the layout of a data input/output line and a column select line in the device of FIGS. 4A and 4B.

To facilitate a better understanding of the architecture of FIGS. 4A and 4B, FIG. 5 illustrates an example of a layout of a data input/output line and a column select line of FIGS. 4A and 4B. The column select line CSL is positioned between the data input/output lines IO and $\overline{IO}$ and this layout is repeated on the same chip as shown in FIG. 5. Referring again to FIG. 2, since the bit line information signal S/A SELECT needs one line with respect to each bit line, even if it is arranged in the different direction from the data input/output line, and the signal lines SEC SELECT having the column information, YREAD and YWRITE are needed in the same direction. In other words, 2 data input/output lines, one signal line SEC SELECT, and one signal line YREAD or YWRITE are needed. In order to obtain high bandwidth, many data input/output lines are required. Hence, the basic structure of at least 4 lines is repeatedly disposed and the area occupied by a chip becomes larger. However, since the data input/output line and column select line of FIG. 5 consisting of the basic structure of 3 lines are repeatedly positioned on an array, the area occupied by the chip can be reduced. Further, since the layout is positioned over the array, the data input/output line of the necessary amount for high bandwidth is sufficiently inserted. Furthermore, since the column select line is positioned between data input/output lines and column select lines are not adjacent to each other, the coupling which may be generated between data input/output lines IO and $\overline{IO}$ is suppressed. Meanwhile, in the same substrate, there are layers to which a bit line and a word line are contained, respectively, between a layer to which the data input/output lines IO and $\overline{IO}$ and the column select line CSL are contained and a substrate, as indicated in FIG. 5. The bit line is formed in the direction of the data input/output lines IO and $\overline{IO}$ and the column select line CSL. The word line is formed at right angles with the data input/output lines IO and $\overline{IO}$ and the column select line CSL. In FIG. 5, although the data input/output lines IO and $\overline{IO}$ and the column select line CSL are repeatedly arranged with a basic structure of 3 lines such as "$\overline{IO}$-CSL-IO", other modifications such as "IO-CSL-$\overline{IO}$" and "IO-$\overline{IO}$-CSL" are possible.

Figure 6:
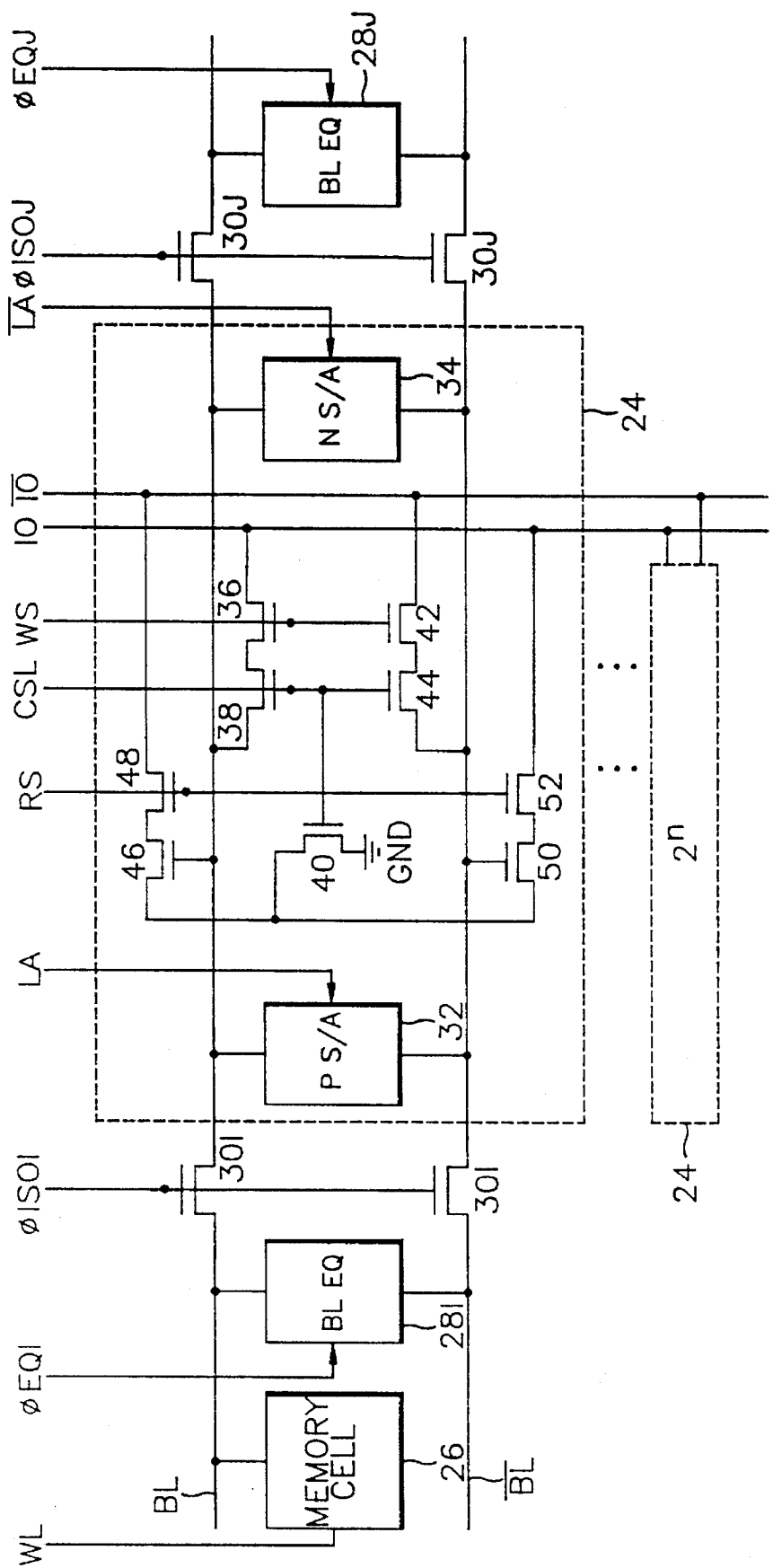
FIG. 6 is a partial, more detailed circuit diagram of a column related circuit constructed in accordance with the device architecture of FIGS. 4A and 4B.

FIG. 6 is a circuit diagram showing a column related circuit of FIGS. 4A and 4B based on the architecture of FIGS. 4A and 4B, i.e. a bit line sensing circuit. A bit line sensing circuit 24 indicated by a dotted line performs a bit line sensing operation. A P-type sense amplifier 32 and an N-type sense amplifier 34 are formed between bit lines BL and $\overline{BL}$ and amplifies data conveyed on the bit line (also referred to in the art as "developing data on the bit line"). A first write transistor 36 has a gate connected to a write select signal WS and a drain connected to data input/output line IO. A second write transistor 38 has a gate connected to a column select signal CSL. Column select line and column select signal have equivalent meaning and are both referred to as CSL herein. A channel connected between a source of the first write transistor 36 and a bit line BL. A discharge transistor 40 has a gate connected to the column select signal CSL and a source connected to a ground voltage terminal GND. A third write transistor 42 has a gate connected to a write select signal WS and a drain connected to a data input/output line $\overline{IO}$. A fourth write transistor 44 has a gate connected to the column select signal CSL and a channel connected between a source of the third write transistor 42 and the bit line $\overline{BL}$. A first read transistor 46 has a gate connected to the bit line BL and a source connected to a drain of the discharge transistor 40. A second read transistor 48 has a gate connected to a read select signal RS and a channel connected between the drain of the first read transistor 46 and the data input/output line $\overline{IO}$. A third read transistor 50 has a gate connected to the bit line $\overline{BL}$ and a source connected to the drain of the discharge transistor 40. A fourth read transistor 52 has a gate connected to the read select signal RS and a channel connected between the drain of the third read transistor 50 and the data input/output line IO.

In FIG. 6, a memory cell 26 selected by activation of the word line WL is provided. A first equalizing circuit 28I for equalizing the left bit lines BL and $\overline{BL}$, first separate transistors 30I for separating the left bit lines BL and $\overline{BL}$, a second equalizing circuit 28J for equalizing the right bit lines BL and $\overline{BL}$, and second separate transistors 30J for separating the right bit lines BL and $\overline{BL}$ are provided. The lines for the read select signal RS and the write select signal WS are extended at right angles with the data input/output lines IO and $\overline{IO}$ or the column select line CSL, i.e., in the same direction as the word line. Control signals φEQI, φISOI, LA, $\overline{LA}$, φISOJ and φEQJ are described in Korea Patent Application No. 92-12436, entitled "Row Redundancy Circuit Sharing A Fuse Box", filed Jul. 13, 1992. The bit line sensing circuit 24 illustrated in FIG. 6 may be practiced by other circuits according to the chip architecture of FIGS. 4A and 4B.

Figure 7A:
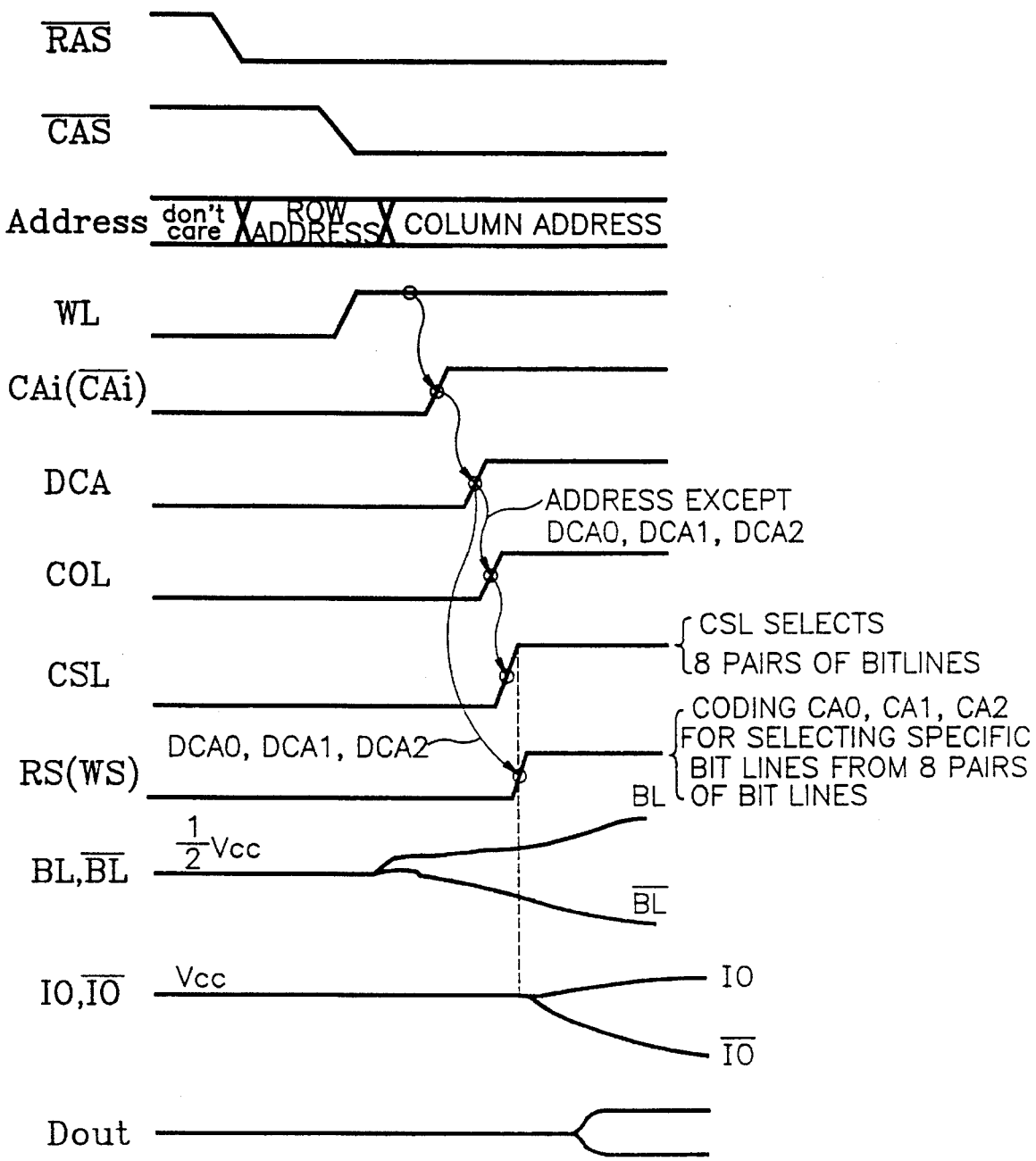
FIGS. 7A and 7B are timing charts showing read and write operations of the bit line sensing circuit of FIG. 6.
Figure 7B:
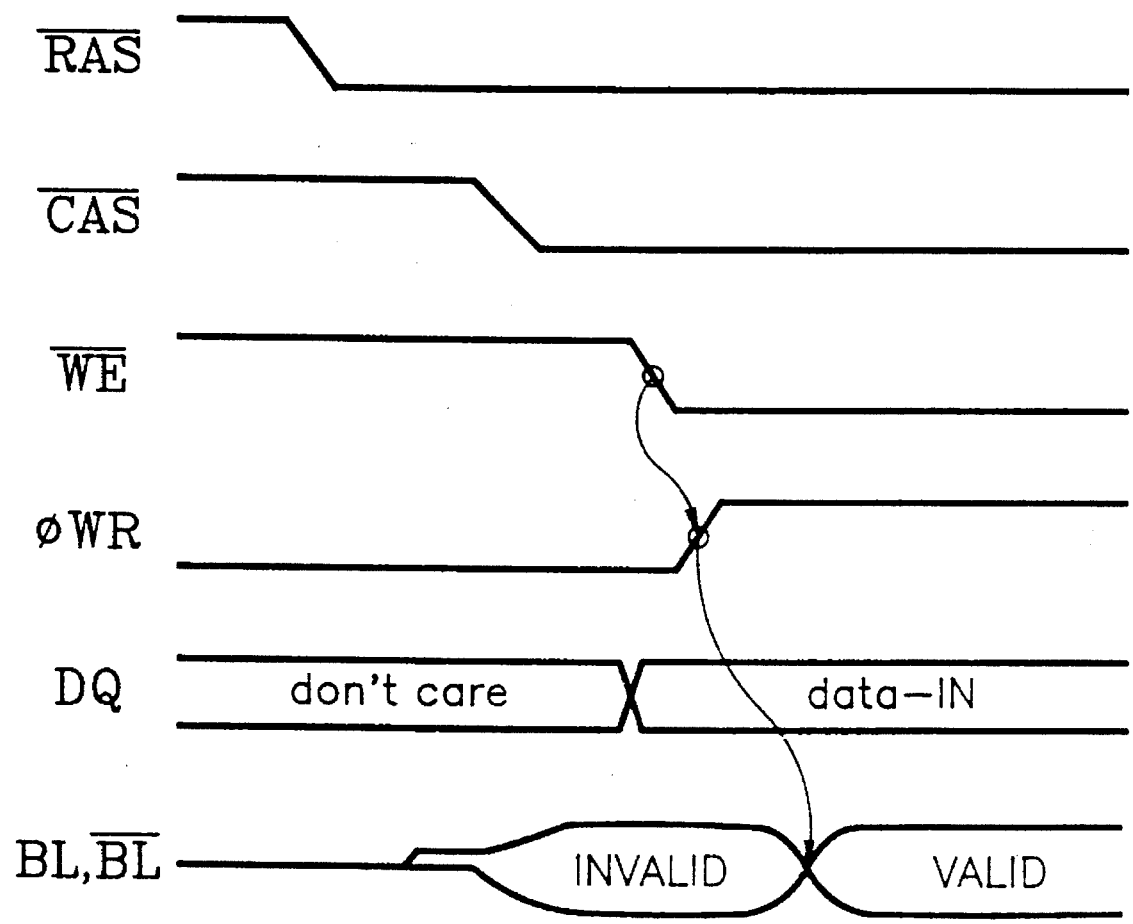

The sensing operation of the bit line sensing circuit 24 of FIG. 6, i.e. the read and write operations of cell data, is now described with reference to FIGS. 7A and 7B.

During the read operation, it is well known that a row address and a column address are applied by the activation of a row address strobe signal $\overline{RAS}$ and a column address strobe signal $\overline{CAS}$, thus specifying a particular memory cell. Accordingly, 256 data bits are generated by a 256 dynamic RAM. Eight pairs of bit lines are connected to one pair of data input/output lines. Therefore, one column select line CSL selects eight pairs of bit lines connected to specific pairs of data input/output lines. Referring to FIG. 7A, the read select signal RS selects a desired pair of bit lines out of eight pairs of bit lines. The read select signal RS is generated by the combination of a decoded address DCA of 0, 1 and 2. If data stored in the memory cell 26 is transmitted to the bit line BL by the enabled word line WL, a voltage difference between the bit lines BL and $\overline{BL}$ is generated by a data level and a voltage is amplified (i.e. developed) by the N-type sense amplifier 34. Thus only one of read transistors 46 and 50 is turned on in response to the voltage level of the bit lines BL and $\overline{BL}$. The discharge transistor 40 is already in a turn-on state by the column select signal CSL. The read transistors 48 and 52 are turned on by the read select signal RS. Then a precharged voltage of the data input/output line IO or $\overline{IO}$ is discharged through conductive path, i.e. a switching path. Hence, a voltage difference between the data input/output lines IO and $\overline{IO}$ is generated and the voltage difference is amplified by amplifier means such as a data input/output line sense amplifier (not shown) Amplifier means need not be provided when the voltage difference between data input/output lines IO and $\overline{IO}$ is sufficiently generated. In such a case, the voltage difference is transmitted to the main data input/output line MIO of FIGS. 4A and 4B. Consequently, data is transmitted through the read transistor 48 or 52 to the data input/output line by selecting one of n (eight in the present embodiment) pairs of bit lines by the read select signal RS. Through the above described path, the data conveyed on the bit line is transmitted to the main data input/output line MIO.

Referring again to FIGS. 4A and 4B, sixteen reference blocks consist of 128 K within the unit array 12, and four main data input/output lines MIO which extend in the longitudinal direction which is perpendicular to the length direction, are in charge of data conveyed on one reference block. Therefore, within one sub array 22, 64 data bits are obtained through 64 main data input/output lines.

During the write operation, if data is supplied through a data input buffer (not shown) from the exterior of a chip and conveyed on the main data input/output line MIO or inline-MIO, the data is again transmitted to the data input/output line IO or $\overline{IO}$. The transmitted data performs the write operation rapidly through the write transistors 36 and 38 or 42 and 44, i.e. two NMOS transistors, by the enabled column select signal CSL of a selected column and the write select signal WS. The write select signal WS selects one of n (eight in the present embodiment) pairs of bit lines.

Figure 8:
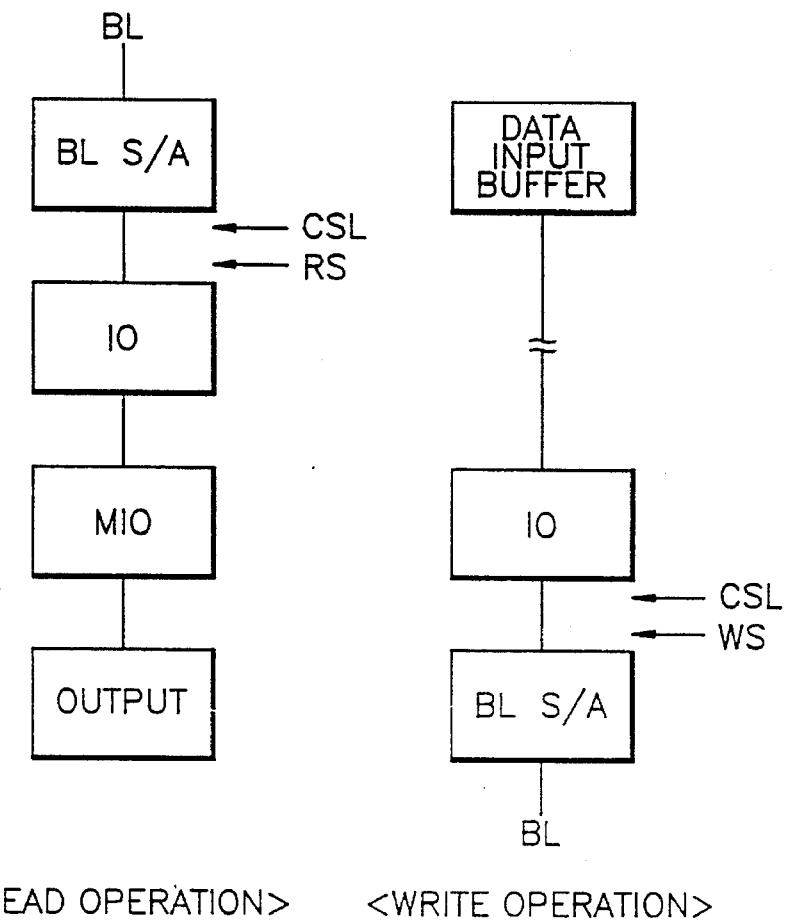
FIG. 8 is a schematic block diagram showing a data input/output path of circuit of FIG. 6.

FIG. 8 is a block diagram showing a data input/output path of FIG. 6 and illustrates a schematic process of the read and write operations.

Figure 1:
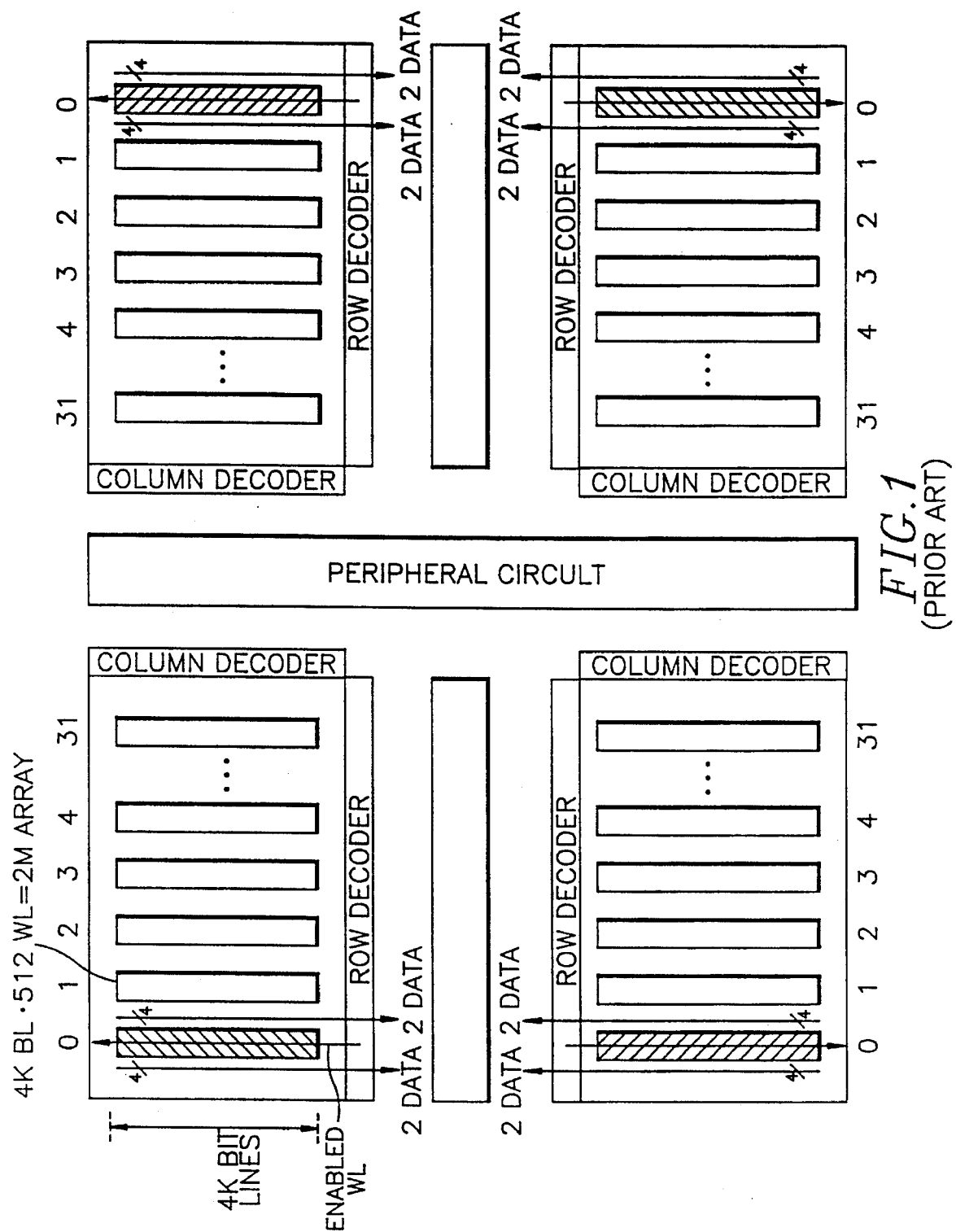
FIG. 1 is a schematic diagram showing an example of a conventional chip architecture of a semiconductor memory.
Figure 2:
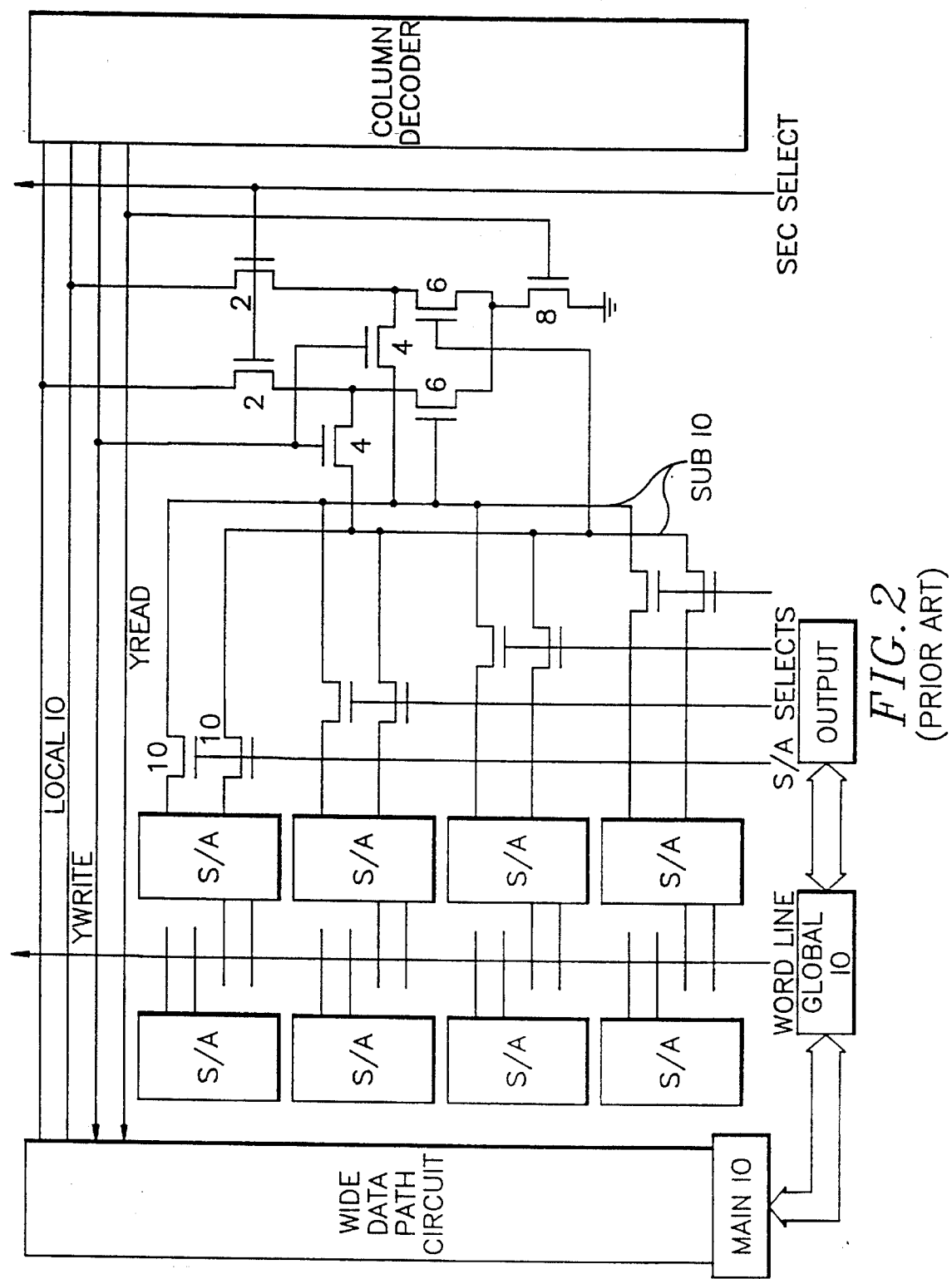
FIG. 2 is a circuit diagram showing another example of a conventional architecture of a data input/output line of a semiconductor memory.
Figure 3:
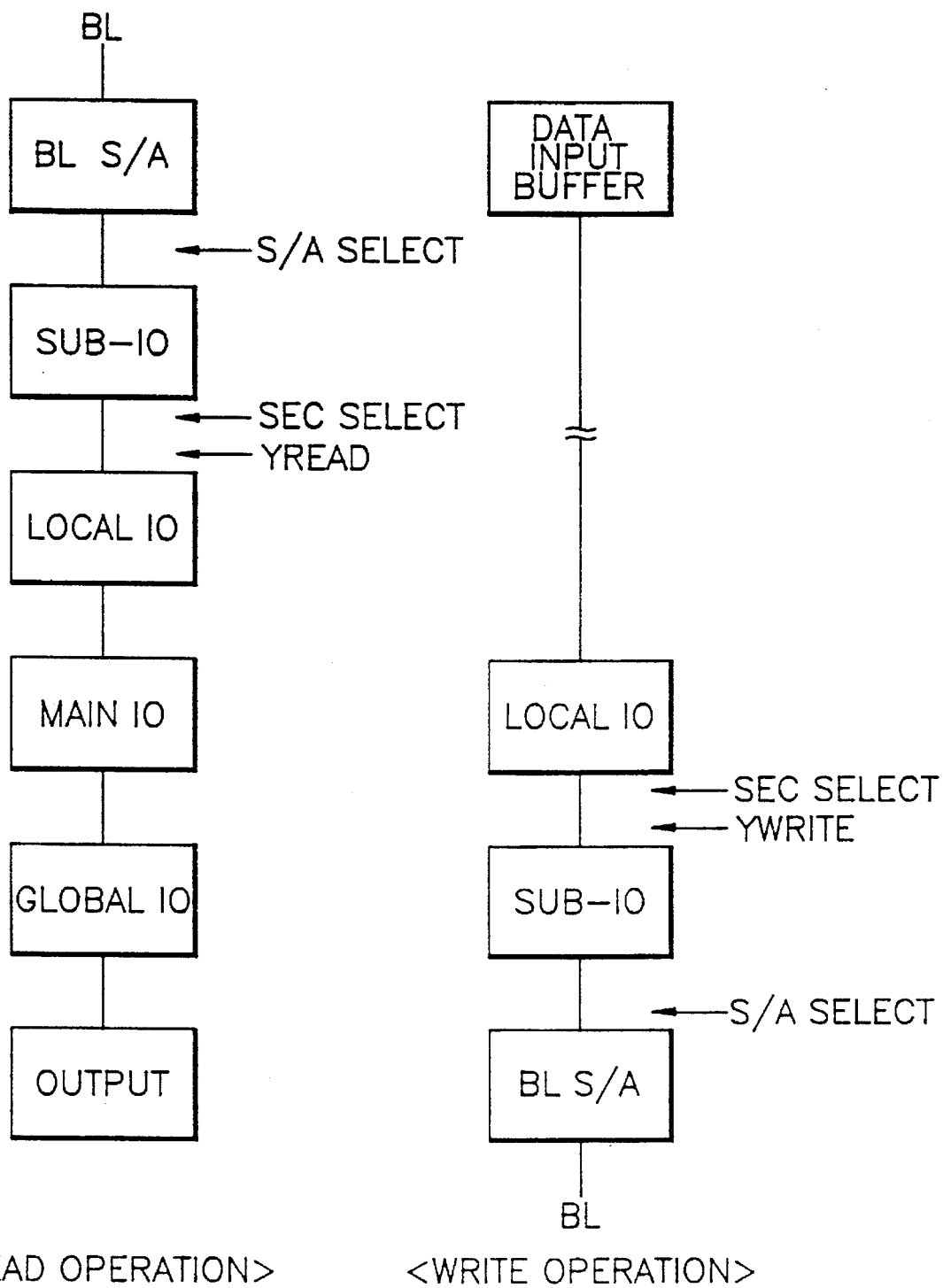
FIG. 3 is a schematic block diagram showing a data input/output path of the conventional architecture of FIG. 2.

In the architecture according to the present invention, there is no need to provide the local data input/output line shown in FIG. 2 in order to achieve high bandwidth such as the output of 256 bits. Therefore the line loading problem occurs only in the main input/output line MIO and the data input/output line IO. When considering the achievement of high bandwidth, the architecture according to the present invention minimizes the line loading problem of the convention architecture. Moreover, not only line speed but layout which has a direct influence on the size of a highly integrated memory is facilitated by the architecture of the present invention. In FIG. 2, five signal lines, i.e. a local data input/output line LOCAL I/O, a sub data input/output line SUB I/O, a write enable signal line YWRITE, a read enable signal YREAD, and a column select line CSL are positioned in the column direction. However, since the architecture of the present invention requires only three signal lines, i.e. the main data input/output line MIO, the data input/output line IO, and the column select line CSL, the present invention is advantageous to high integration. Moreover, since the word line WL, the read select line RS, and the write select line WS are positioned in the length direction of a memory device, the bit line, the data input/output line, and the column select line CSL are preferably disposed at right angles to the word line, thereby efficiently achieving the data input/output of multiple bits. If $2^n$ pairs of bit lines are connected to a pair of data input/output lines, $2^m$ pairs of data input/output lines and $2^m$ column select lines are needed. In the basic block of the preferred embodiment of the invention, a pair of data input/output lines and one column select line are arranged at right angles to the word line. In order to extract multiple input/output data bits, the size of layout can be minimized.

Figure 9:
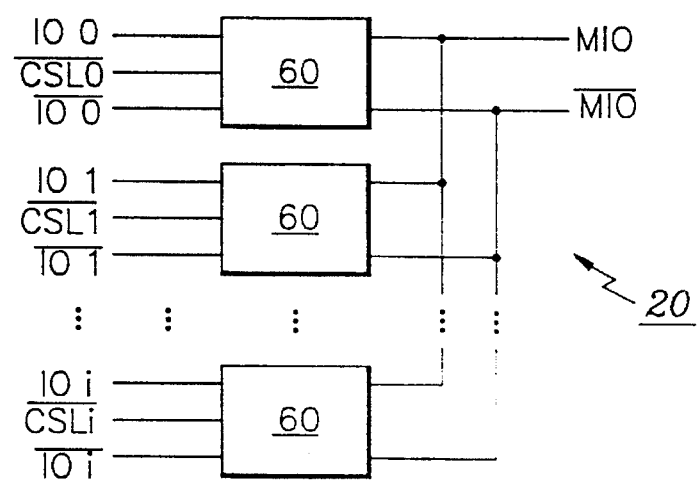
FIG. 9 is a block diagram showing a multiplexer of the device of FIGS. 4A and 4B.

FIG. 9 illustrates the multiplexer 20 of FIGS. 4A and 4B. In FIG. 9, a plurality of unit multiplexers 60 are shown constituting one multiplexer 20. The architecture of FIG. 9 generates 256 bits and thus one unit multiplexer 60 is constructed with respect to eight pairs of data input/output lines.

Figure 10:
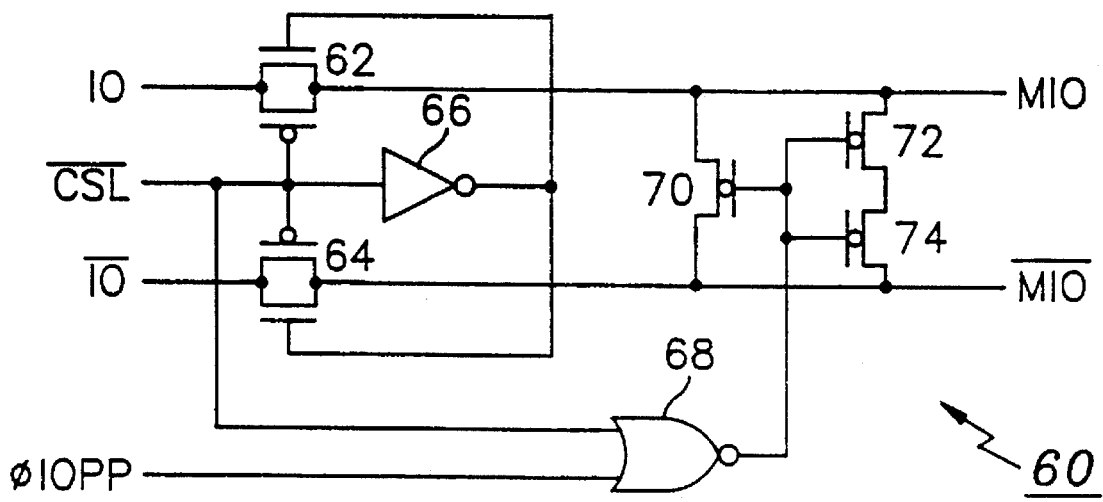
FIG. 10 is a circuit diagram showing a unit multiplexer 60 constituting a multiplexer of FIG. 9.

FIG. 10 shows a circuit diagram of the unit multiplexer 60 of FIG. 9. A first transmission gate 62 connected between the data input/output line IO and the main data input/output line MIO has gates connected to column select signals CSL and $\overline{CSL}$. A second transmission gate 64 connected between the data input/output line $\overline{IO}$ and the main data input/output line $\overline{MIO}$ has gates connected to column select signals CSL and $\overline{CSL}$. A NOR gate 68 receives the complementary column select signal $\overline{CSL}$ and a signal φIOPP. A first PMOS transistor 70 for equalizing the main data input/output lines MIO and $\overline{MIO}$ has a gate connected to the output signal of the NOR gate 68 and the channel connected between the main data input/output lines MIO and $\overline{MIO}$. Second and third PMOS transistors 72 and 74 for precharging the main data input/output lines MIO and $\overline{\text{MIO}}$ have gates connected to the output signal of the NOR gate 68 and channels connected to the main data input/output lines MIO and $\overline{\text{MIO}}$. Referring to FIGS. 9 and 10, only selected data input/output lines IO and $\overline{\text{IO}}$ and a column select line CSL corresponding thereto are enabled, and thus data is transmitted to the main data input/output lines MIO and $\overline{\text{MIO}}$.

Figure 11:
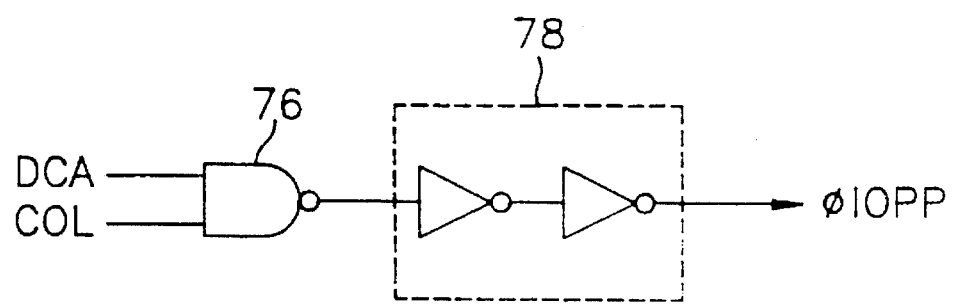
FIG. 11 is a circuit diagram showing a circuit for generating a signal φIOPP applied to a multiplexer of FIG. 10.

FIG. 11 shows a circuit for generating the a signal φIOPP FIG. 10. Enabling processes of input signals DCA and COL are shown in FIG. 7A.

While the invention has been particularly shown and described with reference to certain preferred embodiments thereof, it will be understood by those skilled in the art that foregoing and other changes in form and details may be made without departing from the spirit and scope of the present invention.

What is claimed is:

1. A semiconductor memory device comprising:

a memory cell array having a plurality of reference blocks each storing a plurality of memory cells;

a word line extending in a length direction of said device;

a pair of bit lines including a bit line and a complementary bit line, said pair of bit lines extending in a longitudinal direction of said device, said longitudinal direction being perpendicular to said length direction;

a pair of data input/output lines including a data input/output line and a complementary data input/output line, said pair of data input/output lines extending in said longitudinal direction, said pair of data input/output lines being correspondingly connected to a plurality of said pair of bit lines, and said pair of data input/output lines being formed over said memory cell array; and a column select line extending in said longitudinal direction, being adjacent to said pair of data input/output lines, and controlling a connection of said pair of data input/output lines to said pair of bit lines.

2. A semiconductor memory device according to claim 1, wherein said column select line is formed between said data input/output line and said complementary data input/output line.

3. A semiconductor memory device comprising:

a word line extending in a length direction of said device;

a unit array having a plurality of reference blocks each storing a plurality of memory cells, said reference blocks being formed in said length direction;

a pair of bit lines including a bit line and a complementary bit line, said pair of bit lines extending in a longitudinal direction of said device, said longitudinal direction being perpendicular to said length direction;

a row decoder for enabling said word line;

a column decoder for enabling said pair of bit lines;

a pair of data input/output lines including a data input/output line and a complementary data input/output line, said pair of data input/output lines extending in said longitudinal direction and being correspondingly connected to a plurality of said pair of bit lines;

a column select line formed between said data input/output line and said complementary data input/output line, said column select line controlling a connection of said pair of data input/output lines to said pair of bit lines, said column select line extending in said longitudinal direction; and a pair of main data input/output lines extending in said longitudinal direction, said pair of main data input/output lines being correspondingly connected to a plurality of data input/output lines;

whereby said unit array is activated in said length direction when said device is activated.

4. A semiconductor memory device comprising:

a reference block for storing a plurality of memory cells;

a unit array having a plurality of reference blocks each formed in a length direction of said device;

a sub array having a plurality of unit arrays each formed in a longitudinal direction, said longitudinal direction being perpendicular to said length direction;

a word line extending in said length direction;

a pair of bit lines extending in said longitudinal direction;

a pair of data input/output lines extending in said longitudinal direction, said pair of data input/output lines being correspondingly connected to a plurality of bit lines and being formed over said sub array;

a column gate for connecting said pair of bit lines to said pair of data input/output lines;

a column select line extending in said longitudinal direction and controlling said column gate;

a pair of main data input/output lines connected correspondingly to a plurality of data input/output lines; and a multiplexer for connecting said plurality of data input/output lines to one pair of main data input/output lines;

whereby data is accessed from respective unit arrays by said pair of main data input/output lines.

5. A semiconductor memory device comprising:

a unit array having a plurality of reference blocks formed in a length direction of said device, said reference block storing a plurality of memory cells;

a sub array having a plurality of unit arrays formed in a longitudinal direction, said longitudinal direction being perpendicular to said length direction;

a word line for selecting memory cells within said reference blocks, said word line extending in said length direction;

a pair of bit lines extending in said longitudinal direction;

a pair of data input/output lines extending in said longitudinal direction, said pair of data input/output lines being correspondingly connected to $2^n$ (n=1,2, . . . ) pairs of bit lines;

a read select signal line for selecting said pair of bit lines from among $2^n$ pairs of bit lines connected to said pair of data input/output lines in response to an input of a column address during a read operation of said device;

a write select signal line for selecting a said bit lines from among $2^n$ pairs of bit lines connected to said pair of data input/output lines in response to an input of said column address during a write operation of said device;

a column gate for connecting said pair of bit lines to said pair of data input/output lines;

a column select line extending in said longitudinal direction and controlling said column gate; and a pair of main data input/output lines connected correspondingly through a multiplexer to a plurality of data input/output lines.

6. A semiconductor memory device according to claim 5, wherein said read select signal line and said write select signal line each extend in said length direction.

7. A semiconductor memory device memory cell array comprising:

an array including a plurality of memory cells for storing data;

a plurality of bit lines pairs, each bit line pair including a complementary bit line and a non-complementary bit line, each said bit line pair extending in a longitudinal direction of said device;

a plurality of data input/output line pairs extending in said longitudinal direction and formed over said array, each data input/output line pair including a complementary data input/output line and a non-complementary data input/output line, each said data input/output line pair capable of having a connection being made with certain of said plurality of bit line pairs so that data can be transmitted from each said bit line pair to one of said plurality of data input/output line pairs;

a plurality of column select lines extending in said longitudinal direction and formed over said array, each said column select line being adjacent a corresponding one of said data input/output line pairs and transmitting a column select signal which controls said connection of each said bit line pair to one of said plurality of data input/output line pairs; and a plurality of word lines extending in a length direction of said array, said length direction being perpendicular to said longitudinal direction.

8. A semiconductor memory device memory cell array according to claim 7, wherein each said column select line is formed between said non-complementary data input/output line and said complementary data input/output line for each data input/output line pair.

9. A semiconductor memory device memory cell array according to claim 7 wherein eight or less bit line pairs are connectable to each data input/output line pair.

10. A semiconductor memory device memory cell array according to claim 7 wherein eight or more bit line pairs are connectable to each data input/output line pair.

11. A semiconductor memory device comprising:

a memory cell array having a plurality of reference blocks, each said reference block including:
 a plurality of memory cells for storing data; and
 a plurality of bit lines pairs, each bit line pair including a complementary bit line and a non-complementary bit line, each said bit line pair extending in a longitudinal direction of said device;

a plurality of data input/output line pairs extending in said longitudinal direction and formed over said memory cell array, each data input/output line pair including a complementary data input/output line and a non-complementary data input/output line, each said data input/output line pair capable of having a connection being made with certain of said plurality of bit line pairs so that data can be transmitted from each said bit line pair to one of said plurality of data input/output line pairs;

a plurality of column select lines extending in said longitudinal direction and formed over said memory cell array, each said column select line being adjacent a corresponding one of said data input/output line pairs and transmitting a column select signal which controls said connection of each said bit line pair to one of said plurality of data input/output line pairs; and a plurality of word lines extending through said plurality of reference blocks in a length direction of said device, said length direction being perpendicular to said longitudinal direction.

12. A semiconductor memory device according to claim 11 wherein each said column select line is formed between said non-complementary data input/output line and said complementary data input/output line for each data input/output line pair.

13. A semiconductor memory device according to claim 11 wherein eight or less bit line pairs are connectable to each data input/output line pair.

14. A semiconductor memory device according to claim 11 wherein eight or more bit line pairs are connectable to each data input/output line pair.

15. A semiconductor memory device comprising:

a unit array having a plurality of reference blocks, said plurality of reference blocks arranged in columns in a length direction, each said reference block including:
 a plurality of memory cells for storing data; and
 a plurality of bit lines pairs, each bit line pair including a complementary bit line and a non-complementary bit line, each said bit line pair extending in a longitudinal direction of said device, said longitudinal direction being perpendicular to said length direction;

a plurality of data input/output line pairs extending in said longitudinal direction and formed over said unit array, each data input/output line pair including a complementary data input/output line and a non-complementary data input/output line, each said data input/output line pair capable of having a connection being made with certain of said plurality of bit line pairs so that data can be transmitted from each said bit line pair to one of said plurality of data input/output line pairs; and a plurality of column select lines extending in said longitudinal direction and formed over said unit array, each said column select line being adjacent a corresponding one of said data input/output line pairs and transmitting a column select signal which controls said connection of each said bit line pair to one of said plurality of data input/output line pairs;

a plurality of word lines extending through said plurality of reference blocks in a length direction of said device;

a row decoder for enabling an addressed word line from said plurality of word lines with a word line signal provided along a corresponding word line to a corresponding memory cell, said enabling of said addressed word lines thereby activating said unit array is said length direction;

a column decoder for enabling an addressed bit line pair from said plurality of bit line pairs with said column select signal provided along a corresponding column select line; and a plurality of main data input/output line pairs, each main data input/output line pair connectable to certain ones of said plurality of said data input/output line pairs.

16. A semiconductor memory device according to claim 15 further including a multiplexer, said multiplexer connected between said plurality of main data input/output line pairs and said plurality of data input/output line pairs and controlling which of said certain ones of said plurality of data input/output line pairs that are connected to said main data input/output line pairs.

17. A semiconductor memory device according to claim 16 wherein said plurality of main data input/output line pairs extend in said longitudinal direction.

18. A semiconductor memory device according to claim 15, wherein each said column select line is formed between said non-complementary data input/output line and said complementary data input/output line for each data input/output line pair.

19. A semiconductor memory device according to claim 15 wherein eight or less bit line pairs are connectable to each data input/output line pair.

20. A semiconductor memory device according to claim 15 wherein eight or more bit line pairs are connectable to each data input/output line pair.

21. A semiconductor memory device comprising:

a unit array having a plurality of reference blocks, said plurality of reference blocks arranged in columns in a length direction, each said reference block including:
a plurality of memory cells for storing data; and
a plurality of bit lines pairs, each bit line pair including a complementary bit line and a non-complementary bit line, each said bit line pair extending in a longitudinal direction of said device, said longitudinal direction being perpendicular to said length direction;

a plurality of data input/output line pairs extending in said longitudinal direction and formed over said unit array, each data input/output line pair including a complementary data input/output line and a non-complementary data input/output line, each said data input/output line pair capable of having a connection being made with certain of said plurality of bit line pairs so that data can be transmitted from each said bit line pair to one of said plurality of data input/output line pairs; and a plurality of column select lines extending in said longitudinal direction and formed over said unit array, each said column select line formed between said non-complementary data input/output line and said complementary data input/output line for each data input/output line pair and transmitting a column select signal which controls said connection of each said bit line pair to one of said plurality of data input/output line pairs;

a plurality of word lines extending through said plurality of reference blocks in a length direction of said device;

a row decoder for enabling an addressed word line from said plurality of word lines with a word line signal provided along a corresponding word line to a corresponding memory cell, said enabling of said addressed word lines thereby activating said unit array is said length direction;

a column decoder for enabling an addressed bit line pair from said plurality of bit line pairs with said column select signal provided along a corresponding column select line; and a plurality of main data input/output line pairs, each main data input/output line pair connectable to certain ones of said plurality of said data input/output line pairs.

22. A semiconductor memory device according to claim 21 further including a multiplexer, said multiplexer connected between said plurality of main data input/output line pairs and said plurality of data input/output line pairs and controlling which of said certain ones of said plurality of data input/output line pairs are connected to said main data input/output line pairs.

23. A semiconductor memory device according to claim 21 wherein said plurality of main data input/output line pairs extend in said longitudinal direction.

24. A semiconductor memory device according to claim 21 wherein eight or less bit line pairs are connectable to each data input/output line pair.

25. A semiconductor memory device according to claim 23 wherein eight or more bit line pairs are connectable to each data input/output line pair.

26. A semiconductor memory device comprising:

a sub array having a plurality of unit arrays, said plurality of unit arrays arranged in rows in a longitudinal direction, each said unit array including:

a plurality of memory cells for storing data;
a plurality of bit lines pairs, each bit line pair including a complementary bit line and a non-complementary bit line, each said bit line pair extending in said longitudinal direction of said device, said longitudinal direction being perpendicular to a length direction; and a plurality of word lines extending in said length direction of said device;

a plurality of data input/output line pairs extending in said longitudinal direction through each said unit array and formed over said unit arrays, each data input/output line pair including a complementary data input/output line and a non-complementary data input/output line, each said data input/output line pair capable of having a connection being made with certain of said plurality of bit line pairs so that data can be transmitted from each said bit line pair to one of said plurality of data input/output line pairs; and a plurality of column select lines extending in said longitudinal direction through each said unit array and formed over said unit arrays, each said column select line being adjacent a corresponding one of said data input/output line pairs and transmitting a column select signal which controls said connection of each said bit line pair to one of said plurality of data input/output line pairs;

a row decoder for enabling an addressed word line from said plurality of word lines with a word line signal provided along a corresponding word line to a corresponding memory cell;

a column decoder for enabling an addressed bit line pair from said plurality of bit line pairs with said column select signal provided along a corresponding column select line; and a plurality of main data input/output line pairs, each main data input/output line pair connectable to certain ones of said plurality of said data input/output line pairs; and a multiplexer connected between said plurality of main data input/output line pairs and said plurality of data input/output line pairs and controlling which of said certain ones of said plurality of data input/output line pairs are connected to said main data input/output line pairs.

27. A semiconductor memory device according to claim 26 wherein said unit array is comprised of a plurality of reference blocks reference blocks arranged in columns in a length direction, each said reference block including certain of said plurality of memory cells and certain of said plurality of bit line pairs.

28. A semiconductor memory device according to claim 26 wherein said row decoder is located on a first peripheral edge of said sub array in said longitudinal direction and said column decoder is located on a second peripheral edge of said sub array in said length direction.

29. A semiconductor memory device according to claim 26 wherein said plurality of main data input/output line pairs extend in said longitudinal direction.

30. A semiconductor memory device according to claim 26 wherein eight or less bit line pairs are connectable to each data input/output line pair.

31. A semiconductor memory device according to claim 27 wherein eight or more bit line pairs are connectable to each data input/output line pair.

32. A semiconductor memory device comprising:

a sub array having a plurality of unit arrays, said plurality of unit arrays arranged in rows in a longitudinal direction, each said unit array including:

a plurality of memory cells for storing data;

a plurality of bit lines pairs, each bit line pair including a complementary bit line and a non-complementary bit line, each said bit line pair extending in said longitudinal direction of said device, said longitudinal direction being perpendicular to a length direction; and a plurality of word lines extending in said length direction of said device;

a plurality of data input/output line pairs extending in said longitudinal direction through each said unit array and formed over said unit arrays, each data input/output line pair including a complementary data input/output line and a non-complementary data input/output line, each said data input/output line pair capable of having a connection being made with $2^n (n=1,2,\ldots)$ bit line pairs so that data can be transmitted from each said bit line pair to one of said plurality of data input/output line pairs; and a plurality of column select lines extending in said longitudinal direction through each said unit array and formed over said unit arrays, each said column select line being adjacent a corresponding one of said data input/output line pairs and transmitting a column select signal which controls said connection of each said bit line pair to one of said plurality of data input/output line pairs;

a row decoder for enabling an addressed word line from said plurality of word lines with a word line signal provided along a corresponding word line to a corresponding memory cell;

a column decoder for enabling an addressed bit line pair from said plurality of bit line pairs with said column select signal provided along a corresponding column select line;

a plurality of read select signal lines for transmitting a read select signal which selects one of said $2^n$ bit line pairs for connection to one of said plurality of data input/output line pairs during a read operation of said device;

a plurality of write select signal lines for transmitting a write select signal which selects one of said $2^n$ bit line pairs for connection to one of said plurality of data input/output line pairs during a write operation of said device; and a plurality of main data input/output line pairs, each main data input/output line pair connectable to certain ones of said plurality of said data input/output line pairs.

33. A semiconductor memory device according to claim 32 further including a multiplexer connected between said plurality of main data input/output line pairs and said plurality of data input/output line pairs and controlling which of said certain ones of said plurality of data input/output line pairs are connected to said main data input/output line pairs.

34. A semiconductor memory device according to claim 32 wherein each of said plurality of read select signal lines and each of said plurality of write select signal lines extend in said length direction.

35. A semiconductor memory device according to claim 32 wherein said unit array is comprised of a plurality of reference blocks, said reference blocks arranged in columns in a length direction, each said reference block including certain of said plurality of memory cells and certain of said plurality of bit line pairs.

36. A semiconductor memory device according to claim 32 wherein said plurality of main data input/output line pairs extend in said longitudinal direction.

37. A semiconductor memory device according to claim 32 wherein eight or less bit line pairs are connectable to each data input/output line pair.

38. A semiconductor memory device according to claim 32 wherein eight or more bit line pairs are connectable to each data input/output line pair.

* * * * *